United States Patent [19]

Ivanov

[11] Patent Number: 5,778,302

[45] Date of Patent: Jul. 7, 1998

[54] METHODS OF MAKING CR-ME SPUTTER TARGETS AND TARGETS PRODUCED THEREBY

[75] Inventor: Eugene Y. Ivanov, Grove City, Ohio

[73] Assignee: Tosoh SMD, Inc., Grove City, Ohio

[21] Appl. No.: 550,256

[22] Filed: Oct. 30, 1995

Related U.S. Application Data

[60] Provisional application No. 60/003,734, Sep. 14, 1995.

[51] Int. Cl.$^6$ .................... B22F 1/00; B22F 3/14
[52] U.S. Cl. .................... 419/32; 419/49; 419/23
[58] Field of Search .................... 419/32, 49, 23

[56] References Cited

U.S. PATENT DOCUMENTS

| | | | |
|---|---|---|---|
| 4,126,451 | 11/1978 | Nayar | 75/208 R |
| 4,135,286 | 1/1979 | Wright et al. | 29/420 |
| 4,277,540 | 7/1981 | Aine | 428/627 |
| 4,331,476 | 5/1982 | Helderman et al. | 75/214 |
| 4,411,963 | 10/1983 | Aine | 428/622 |
| 4,552,820 | 11/1985 | Lin et al. | 428/611 |
| 4,652,499 | 3/1987 | Howard | 428/641 |
| 4,654,276 | 3/1987 | Ahlert et al. | 428/641 |
| 4,663,120 | 5/1987 | Parent et al. | 419/10 |
| 4,677,032 | 6/1987 | Robinson | 428/611 |
| 4,750,932 | 6/1988 | Parent et al. | 75/228 |
| 4,915,805 | 4/1990 | Rust | 204/192.12 |
| 4,963,240 | 10/1990 | Fukasawa et al. | 204/192.15 |
| 5,053,250 | 10/1991 | Baseman et al. | 427/131 |
| 5,220,349 | 6/1993 | Salta et al. | 346/76 PH |
| 5,282,943 | 2/1994 | Lannutti et al. | 204/192.12 |
| 5,282,946 | 2/1994 | Kinoshita et al. | 204/298.13 |
| 5,334,267 | 8/1994 | Taniquchi et al. | 148/425 |
| 5,338,422 | 8/1994 | Belkind et al. | 204/192.12 |
| 5,342,496 | 8/1994 | Stellrecht | 204/298.12 |
| 5,359,352 | 10/1994 | Salta et al. | 347/62 |

OTHER PUBLICATIONS

ASM Handbook, vol. 7, Powder Metallurgy, 1984, pp. 215, 722–727.

"Reactive Mechanical Alloys in Material Synthesis", E. Ivanov, Journal of Materials Synthesis and Processing, vol. 1, No. 6, 1993, pp. 405–413.

"5 Mechanical Milling and Alloying", Carl C. Koch, Materials Science and Engineering Department, North Carolina State University.

Material Science and Technology, vol. 15, Chapter 5, pp. 194–245, 1991.

*Primary Examiner*—Daniel J. Jenkins
*Attorney, Agent, or Firm*—Biebel & French

[57] ABSTRACT

Methods for making Cr-Me sputter targets wherein Me is a metal are disclosed. Preferably Me is a transition metal and most preferably is a member selected from the group consisting of Cu, Fe, and V. As a first step in the method, Cr and Me powder or crystals on the order of less than 100 mesh are provided. Preferably, the powders or crystals have a size of about 6–8 mesh. The Cr is present in a weight ratio amount of at least 50% Cr based upon the total combined weight of Cr and Me present. The Cr and Me components are then mechanically alloyed in a high energy ball mill or the like so as to provide an intimate mixture of powdered Cr-Me. The resulting powder is screened with, for example, a −20 −70 mesh screen, and then subjected to hot isostatic pressing (HIP) conditions to consolidate the powders at pressures of about 10,000 to 45,000 psi and temperatures of 800° C. to 1500° C. for about ¼ to 5 hours. The HIP can is then opened, and the resulting consolidated mass or billet is cut and machined into the desired target size and shape.

15 Claims, 2 Drawing Sheets

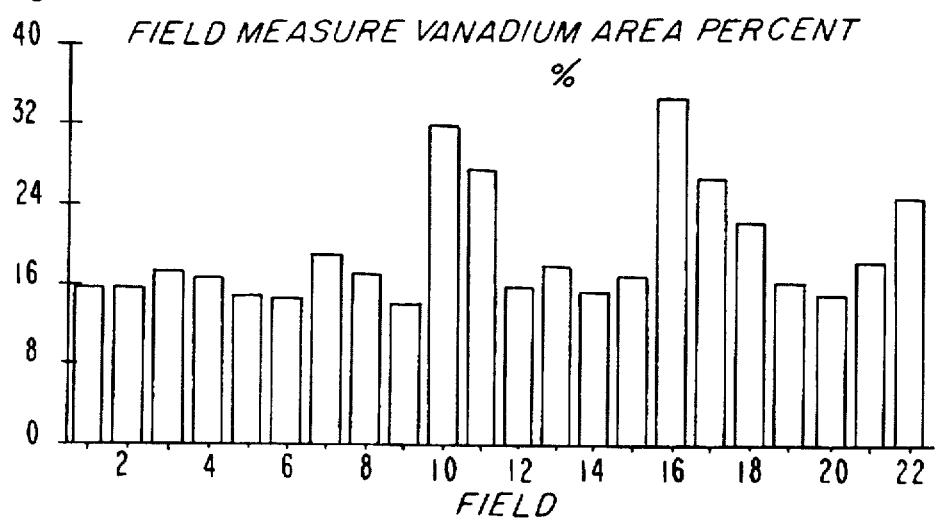
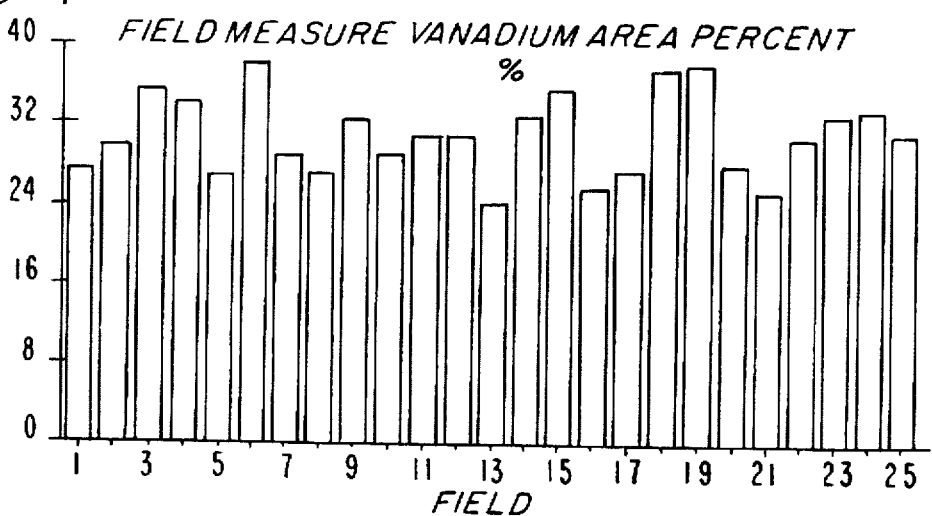
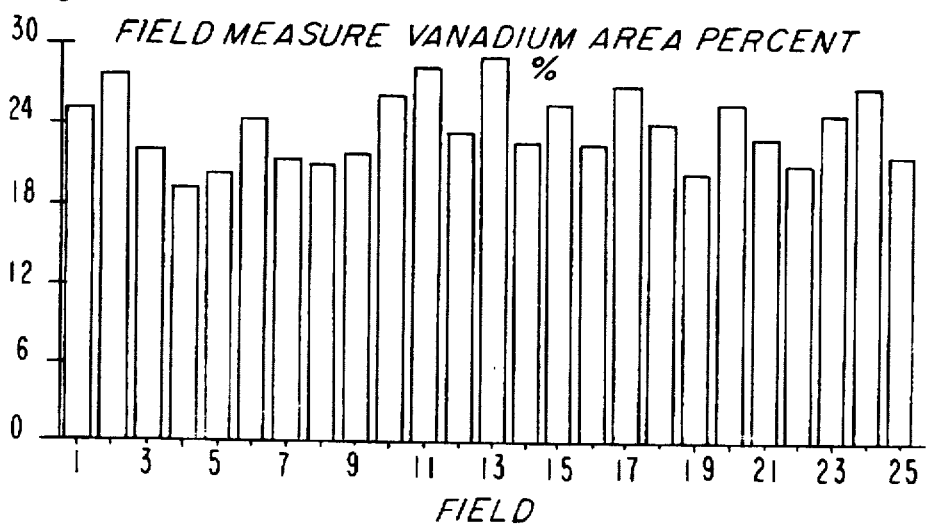

METHODS OF MAKING CR-ME SPUTTER TARGETS AND TARGETS PRODUCED THEREBY

RELATED APPLICATION

This application claims the benefit of prior U.S. provisional application Ser. No. 60/003,734 filed on Sep. 14, 1995.

FIELD OF THE INVENTION

The present invention pertains to processes for making Cr-metal sputter targets and targets made thereby.

BACKGROUND OF THE INVENTION

Cr-V and Cr-Fe underlayers are often used between a magnetic layer and substrate in the formation of magnetic recording disks. Typically, the Cr-V and Cr-Fe thin layers are placed over the desired substrate by a cathodic sputter coating method so that the thickness and uniformity of the desired thin film can be carefully controlled. Similarly, Cr-Cu layers are often used as hard disk coatings in computer applications.

The task of producing Cr-containing sputter targets to deposit these coatings has not been without problem. Melting of pure Cr or Cr alloys containing another metal has not always been possible due to high melting points associated with Cr or the alloy, high Cr vapor pressures, or immiscibility of Cr with the second metal. Melting and casting of Cr-V alloys resulted in high porosity, low purity, cast blanks due to large volume changes that occurred during alloy solidification stages. It was then necessary to HIP (hot isostatic press) the blanks to heal the cavitation and porosity problems. Nevertheless, the cast alloys were brittle, and exhibited a large grain size on the order of several thousand microns. Brittleness of sputter target metals is a product defect that leads to undesirable particulate emissions in the sputtering process.

Powder metallurgical (PM) techniques for the production of Cr-containing alloy targets have also met with only marginal success. For example, traditional Cr and V powder blending techniques demonstrate unacceptable Cr and V phase segregation, due, probably, to the lower density of V (compared to Cr) and its tendency therefore to migrate toward the top in blended mixtures. HIPing of such mixtures resulted in billets of poor uniformity with targets formed from these billets reflecting this undesirable characteristic. Difficulties in meeting customer alloy formulation specifications were sometimes reported when these traditional PM approaches were taken.

Accordingly, there is a need in the art for a method for producing Cr-containing alloys for subsequent sputter target manufacture, which method will provide for an intimate mix of Cr and alloy metal without exhibiting undesirable phase separation.

There is a more specific need in the art for a method that results in a uniform, consolidated, dispersion of Cr and alloy metal that will serve as a precursor for formation of uniform sputter targets that more consistently meet customer alloy formulation and purity specifications.

SUMMARY OF THE INVENTION

In accordance with the invention, methods for making Cr-Me sputter targets wherein Me is a metal are disclosed. Preferably Me is a transition metal and most preferably is a member selected from the group consisting of Cu, Fe, and V.

As a first step in the method, Cr and Me powder or crystals on the order of less than 100 mesh are provided. Preferably, the powders or crystals have a size of about 6–8 mesh. The Cr is present in a weight ratio amount of at least 50% Cr based upon the total combined weight of Cr and Me present. The Cr and Me components are then mechanically alloyed in a high energy ball mill or the like so as to provide an intimate mixture of powdered Cr-Me. The resulting powder is screened with, for example, a −20 −70 mesh screen, and then subjected to hot isostatic pressing (HIP) conditions to consolidate the powders at pressures of about 10,000 to 45,000 psi and temperatures of 800° C. to 1500° C. for about ¼ to 5 hours. The HIP can is then opened, and the resulting consolidated mass or billet is cut and machined into the desired target size and shape.

The invention will be explained in detail in conjunction with the attached drawings and following detailed description.

DRAWINGS

FIG. 3 is a graphical representation of the amount of V present in a measured surface area of a prior art Cr V target as set forth in Example 3a;

FIG. 4 is a graphical representation of the amount of V present in a measured surface area of a Cr V sample target in accordance with the invention, as set forth in Example 3(b); and FIG. 5 is a graphical representation of the amount of V present along the surface of another Cr V sample target in accordance with the invention, as set forth in Example 3(c).

DETAILED DESCRIPTION

Figure 1:
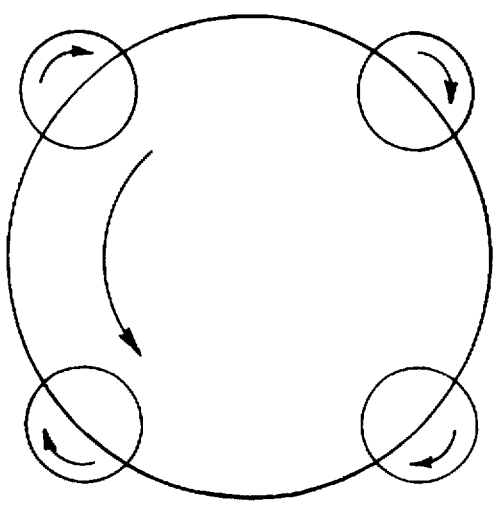
FIG. 1 is a diagrammatic section view of a planetary ball mill that may be used for mechanically alloying the Cr and other metal components (Me)in accordance with the invention.

The present invention pertains to methods for making Cr-Me sputter targets wherein Me is a metal. Preferably Me is a transition metal and most preferably is a member selected from the group consisting of Cu, Fe, and V.

As a first step in the method, Cr and Me powder or crystals on the order of less than 100 mesh are provided. Preferably, the powders or crystals have a size of about 6–8 mesh. The Cr is present in a weight ratio amount of at least 50% Cr based upon the total combined weight of Cr and Me present. The Cr and Me components are then mechanically alloyed in a high energy ball mill or the like so as to provide an intimate mixture of powdered Cr-Me. The resulting powder is screened with, for example, a −20 −70 mesh screen, and then subjected to hot isostatic pressing (HIP) conditions to consolidate the powders at pressures of about 10,000 to 45,000 psi and temperatures of 800° C. to 1500° C. for about ¼ to 5 hours.

The HIP can is then opened, and the resulting consolidated mass or billet is cut and machined into the desired target size and shape.

The Cr powder to be used may be Cr crystal or Cr flake. Preferably, crushed Cr flake is used. The flake is formed as a result of electrolysis processes and is commercially available, for instance, from AdMa, Inc. Twinsburg, Ohio. The electrolytic flake which is used as a starting material may be produced from electrolysis of $Na_2Cr_2O_7$ or $Cr_2O_3$, with flakes of Cr being removed from the cathode. These flakes show high purity (e.g. 3N–4N) and have low Fe content on the order of $\leq 100$ ppm. The Cr flakes are generally oblong or circular in shape when viewed in plan and have a mean diameter of about 8–10 mm and an average thickness of about 1–3 mm.

The Cr flakes are crushed in an impact mill or hammer mill resulting in an average particle size on the order of about 2–4 mm (i.e. ≈6–8 mesh). The crushed flakes are about 99.9% pure Cr.

The crushed Cr flakes and the Me powder or crystal are blended in appropriate proportion with the Me being provided in a mesh size of about 8–100 mesh. Next, the Cr and Me components are mechanically alloyed in accordance with well-known techniques such as high energy ball milling in a planetary ball mill as discussed in *Material Science and Technology*, editors Cahn, Haasen and Kramer, Volume 15, 1991, pp. 194–241. For example, the mixed powders may be worked in a planetary ball mill of the type having a plurality of hardened steel balls or vanadium balls for a period of time depending on milling conditions such as ball to powder charge ratio, rotation speed, etc. Generally, the mixed powders are mechanically alloyed for a period of about 10 minutes to 2 hours. The containers are rotated at about 500–1000 r.p.m. During the mechanical alloying step, the hardened steel or vanadium balls are accelerated to at least about 600 m/sec$^2$. One exemplary ball mill which may be used to mechanically alloy the Cr and Me components is the Retsch Planetary Ball Mill sold in America by Brinkman Instruments, Inc. of Westbury, N.Y.

Turning now to FIG. 1 of the drawings there is shown a planetary ball mill 2 of the type that can be utilized to provide the mechanical alloying step of the invention. Planetary ball mill 2 comprises rotatable sun wheel 4 and grinding stations 6,8,10,12 mounted on the sun wheel. Each of the stations is spaced at about 90° from neighboring jars around the circumference of sun wheel 4.

As shown, the sun wheel is rotatable in the counterclockwise direction around axis 4a. The grinding stations 6,8,10, 12 rotate in a clockwise direction around their own axes in opposite direction to the sun wheel rotation direction. The grinding stations accordingly orbit around the sun wheel in a planetary motion pattern.

Figure 2:
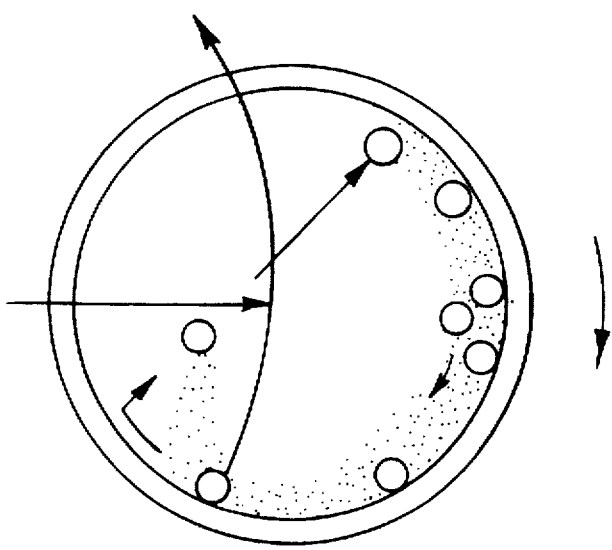
FIG. 2 is a diagrammatic section of one of the grinding stations shown in FIG. 1.

As shown in FIG. 2, grinding station 6 comprises a thick wall 14 structure to facilitate crushing or pulverization of the Cr-Me particles 16 disposed therein. Station 6 rotates in the direction indicated by arrow 18. The rotational direction of sun wheel 4 is designated by arrow 20. Balls 22 are forced along the inside periphery of wall 14 via centrifugal force represented by arrow 24; thereby mechanically alloying the particles 16. The planetary ball mill provides for a violent impacting of the balls 22 on the particles 16 due to the path of the balls 22 as shown in FIG. 2 as dictated by centrifugal force. As previously stated, the balls 22 are accelerated to at least about 600 m/sec$^2$.

In accordance with the mechanical alloying step, the majority of the Me particles are ground and cold welded to the Cr particles, reducing Me/Cr phase separation that characterized many of the prior art processes that included mixing of the Me and Cr powders together prior to HIPing. The Me particles, as a result of this step, are reduced substantially in size.

The thus mechanically alloyed, substantially welded Cr-Me particles are screened with a –20 –70 mesh screen to collect particles of about 0.2–0.3 mm in size. These particles are then loaded into a HIP canister and are subjected to HIPing procedure. After HIPing, the thus formed billet is cut and machined to the final desired shape for usage as a sputter target.

The invention will be further described in conjunction with the following examples which are to be regarded as being illustrative and should not be construed as limiting the invention.

EXAMPLES

Example 1

Cr powder from crushed Cr flake is provided. The powder has a particle size of ≈6–8 mesh and a purity of 99.95% Cr. The Cr powder is blended with from 6–20 wt % Cu powder (–100 mesh). The resulting mixed powders are mechanically alloyed in a planetary ball mill having hardened steel balls rotating at 750 r.p.m. The ball:powder ratio is 2:1. Mechanical alloying proceeds for a period of 10–30 minutes. The resulting powder is then HIPed at 1000° C., 15,000 psi for 3 hours.

Example 2

Cr powder identical to that specified in Example 1 is blended with 3–50 wt % V crystals (6–8 mesh). The blend is then mechanically alloyed in a planetary ball mill having (hardened vanadium) balls in steel containers rotating at 750 r.p.m. The ball:powder ratio is 2:1. Mechanical alloying proceeds for a period of 10–30 minutes. The resulting powder is then HIPed at 1200° C., 15,000 psi for 3 hours.

Example 3

Uniformity Studies

In order to demonstrate the efficacy of the instant methods in preparing highly uniform Cr-V targets, comparative studies were undertaken using a Buehler Omnimet Optical Imaging System Program available from Buehler, Ltd., Lake Bluff, Ill. This system is capable of analyzing an image and calculates surface areas presented by different components or species in a plurality of unit area fields in a sample surface area.

3a

Comparative Study

A Cr 20V target sample was made via conventional powder metallurgy techniques. A mixture of –100 mesh Cr and –80 V in appropriate proportion by weight were blended together for ½ hour. The blend was then placed in a HIP canister and HIPed at 1180° C. under pressure of 15,000 psi for a period of three hours. The resulting HIPed sample was sliced, polished and analyzed for V content via the Buehler Omnimet Imaging program described above.

A graphical representation of the V measured in each of measured fields is shown in FIG. 3. The following uniformity parameters were measured:

| | |
|---|---|
| Minimum V area present in field: | 13.92% |
| Maximum V area present in field: | 34.787% |
| Mean V area present: | 19.467% |
| Standard deviation: | 5.895% |
| Number of fields counted: | 22 |

$$\text{variance} = \frac{\text{standard deviation}}{\text{Mean V area present}} = .3028$$

3b

Mechanically alloyed Cr 20V Target

A Cr 20V target sample was prepared in accordance with Example 2. Mechanical alloying of the Cr-V mixture was carried out for 20 minutes. The sample was sliced, polished and analyzed for V content via the Buehler Omnimet Imaging program described above.

A graphical representation of the V measured in each of the measured fields is shown in FIG. 4. The following uniformity parameters were measured:

| | |
|---|---|
| Minimum V area present in field: | 24.084% |
| Maximum V area present in field: | 38.107% |
| Mean V area present: | 30.836% |
| Standard deviation: | 4.054% |
| Number of fields counted: | 25 |

$$\text{variance} = \frac{\text{standard deviation}}{\text{Mean V area present}} = .1314$$

3c

Mechanically Alloyed Cr 20V Target

A Cr 20V target sample was prepared in accordance with example 2 except that mechanical alloying of the blend was carried out for 30 minutes. The resulting sample was sliced, polished and analyzed for V content with the Buehler Omninet Imaging program described above.

A graphical representation of the V measured in each of the measured fields is shown in FIG. 5. The following uniformity parameters were measured:

| | |
|---|---|
| Minimum V area present in field: | 19.298% |
| Maximum V area present in field: | 28.962% |
| Mean V area present: | 23.713% |
| Standard deviation: | 2.709% |
| Number of fields counted: | 25 |

$$\text{variance} = \frac{\text{standard deviation}}{\text{Mean V area present}} = .1142$$

Discussion Example 4

It is apparent that the step of mechanical alloying of the Cr-V blend, prior ti HIPing results in a highly uniform distribution of V throughout the Cr matrix. A Cr-V alloy is therefore provided that results in an improved, highly uniform V distribution throughout the alloy as measured along the surface.

In those processes in which Cr-V sputter targets are to be provided, it is especially advantageous to use V crystals as the V source. In some of the prior art methods, V powders were used. These necessitate hydrogenation of the powder to form vanadium hydride, followed by milling, screening and a dehydrogenation step prior to blending with Cr. In contrast to these prior art processes, processes in accordance with the invention, as specified in Example 2, utilize V crystals as the precursor V source. These crystals are commercially available from Trinetec Corp., Twinsburg, Ohio.

In some of the prior art processes in which vanadium hydride was used as the V precursor source, high gas concentrations (up to 2,400 ppm) consisting predominantly of $O_2$ and $N_2$ gases were detected, probably due to the methods of hydriding, milling and screening that were used to provide the V powder. Use of V crystals as the precursor has shown a tendency to reduce such contamination.

The present invention shows particular advantage in the production of Cr 3–50 V sputter targets having a variety of shapes such as the circular planar and circular convex target shapes demonstrated for example in U.S. Pat. Nos. 5,342, 496 and 5,282,943 (of common assignment herewith). Additionally, planar rectangularly shaped targets can also be mentioned.

Targets produced in accordance with the above processes may be used to provide requisite sputtered coating layers in magnetic recording mediums. For example, Cr V or Cr Fe layers may be used as underlayers in combination with an overlying Co Pt magnetic layer as suggested in U.S. Pat. No. 4,652,499. In this regard Cr 20 V; Cr 10 V; and Cr 50 V sputter targets of high uniformity may be provided and have demonstrated utility in the formation of Cr V underlayer coatings used in the production of such magnetic recording mediums.

The mechanical alloying step described above is critical to performance. As used herein, it means that an intimate mix of the Cr-Me particles is formed with the majority of Me particles present cold welding to the Cr particles.

Although Applicant is not to be bound to any particular theory of operation, it is thought that the action of cold welding of substantial amounts of the Me particles to the Cr particles results in a more uniform, homogenous particle mix than in the prior art processes in which distinct phase separation of Cr and Me particles occurred. This phase separation, after subsequent HIPing and shaping of the resulting billet to required sputter target shape and size, often times resulted in target compositions that did not conform with requisite material specifications.

The methods above described, which involve mechanical alloying of the blend of Cr and Me, preferably V, result in the formation of a target comprising a two phase Cr-V alloy wherein V is present in an amount of about 3–50%. The target composition is characterized by having improved V content uniformity throughout and, as measured along a surface area of the target composition consisting of a plurality of unit area fields, exhibiting a V variance of less than about 0.3, preferably $\leq 0.2$, and most preferably $\leq 0.15$.

The V variance is measured by taking the standard deviation in V % present in the sum of the field areas and dividing it by the mean % V present in the measured field areas.

The Cr-V targets in accordance with the invention can therefore be defined in terms of both the standard deviation of V present and in the variance as defined above. As to the standard deviation in V % present, in accordance with the invention, this can be less than 5.00% and is preferably less than about 4.25%.

While the methods described herein and sputter targets made by such methods have been described above in conjunction with certain specific forms and modifications thereof, it will be appreciated that a wide variety of other modifications can be made without departing from the spirit and scope of the invention as defined in the appended claims.

What is claimed is:

1. A method for making a Cr-Me containing sputter target comprising:
    (a) providing a blend including Cr powder of less than 100 mesh and Me powder of less than 100 mesh wherein Me is a metal;
    (b) mechanically alloying said blend of particles;
    (c) subjecting said mechanically alloyed blend to hot isostatic pressure conditions to consolidate said mechanically alloyed blend;
    (d) shaping said consolidated mechanically alloyed blend to a shape desired for use as a sputter target.

2. A method for making a Cr-Me containing sputter target as recited in claim 1 wherein Me is a transition metal.

3. A method for making a Cr-Me containing sputter target as recited in claim 2 wherein said transition metal comprises a member selected from the group consisting of Cu, Fe, and V.

4. A method as recited in claim 3 wherein in said step (a) said Cr and said Me powders are both from about 6–8 mesh in size.

5. A method as recited in claim 3 wherein said step (c) comprises subjecting said mechanically alloyed blend to temperatures of about 800° C.–1500° C. and pressure of about 10,000 psi to 45,000 psi for a time of about ¼ hour to 5 hours.

6. A method as recited in claim 5 wherein said step (c) comprises subjecting said mechanically alloyed blend to temperatures of about 1000°–1200° C. and pressure of about 15,000 psi for about 3 hours.

7. A method as recited in claim 1 wherein said step (a) comprises crushing Cr flake to particles of about 2–4 mm to form said Cr powder.

8. A method for making a sputter target comprising Cr 3–50 V comprising:

(a) providing Cr powder of less than 100 mesh;

(b) providing a V powder of less than 100 mesh;

(c) combining said Cr powder and V powder in amounts sufficient to form a blend of Cr 3–50 V;

(d) ball milling said blend in a high energy ball mill to mechanical alloy said Cr and V blend whereby an intimate mixture is formed with the majority of V particles cold welded to said Cr particles;

(e) hot isostatically pressing (HIPing) said mixture formed in step (d) at a temperature of about 800°–1500° C. and pressure of about 10,000 psi to 45,000 psi for a time period of about ¼ hour to 5 hours, to consolidate said mixture;

(f) shaping said consolidated mechanically alloyed blend to a shape desired for use as a sputter target.

9. Method as recited in claim 8 wherein after said step (d) and before said step (e), said method comprises screening said mixture formed in step (d).

10. Method as recited in claim 8 wherein said step (a) comprises providing Cr flakes having a particle size diameter of about 8–10 mm and an average thickness of about 1–3 mm and then crushing said flakes to result in said Cr powder.

11. Method as recited in claim 8 wherein said step (b) comprises providing V crystals having crystal sizes of about 6–8 mesh.

12. Method as recited in claim 8 wherein said step (e) comprises subjecting said intimate mixture to temperatures of about 1000°–1200° C. and pressure of about 15,000 psi for about 3 hours.

13. Method of preparing a Cr-3-50 V sputter target comprising:

providing a blend of Cr and V powders each of about less than 100 mesh and each provided in a necessary amount to form a blend of Cr-V wherein between about 3–50 wt % V is present based on the combined weight of Cr and V;

ball milling said blend to provide a mechanical alloy of said Cr and V powders wherein an intimate mixture is formed with a majority of said V powder being cold welded to said Cr powder, subsequently;

hot isostatically pressing said blend at a temperature of about 800° C. to 1500° C., pressure of about 10,000 psi to about 45,000 psi and for a period of about ¼ hour to 5 hours to provide a consolidated billet; and forming said billet into a shape desire for use as a sputter target.

14. Method as recited in claim 13 wherein said ball milling comprises ball milling said blend in a planetary ball mill for a period of 10 min. to about 30 min., said planetary ball mill having a plurality of containers, each container comprising hardened balls disposed therein, each container rotating ball each rotating at about 500 to 1000 r.p.m.

15. Sputter target produced by the method of claim 8.

* * * * *